(12) United States Patent
Zhang et al.

(10) Patent No.: US 11,508,763 B2
(45) Date of Patent: Nov. 22, 2022

(54) METHOD FOR MANUFACTURING ARRAY SUBSTRATE, ARRAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Taoran Zhang, Beijing (CN); Jiawei Qu, Beijing (CN); Linxuan Li, Beijing (CN); Wenjun Liao, Beijing (CN); Zailong Mo, Beijing (CN)

(73) Assignees: CHENGDU BOE OPTOELECTRONICS TECHNOLOGY CO., LTD., Sichuan (CN); Beijing BOE Technology Development Co., Ltd., Beijing (CN)

( * ) Notice: Subject to any disclaimer, the term of this patent is extended or adjusted under 35 U.S.C. 154(b) by 7 days.

(21) Appl. No.: 16/760,009

(22) PCT Filed: Sep. 28, 2018

(86) PCT No.: PCT/CN2018/108324
§ 371 (c)(1),
(2) Date: Apr. 28, 2020

(87) PCT Pub. No.: WO2019/134409
PCT Pub. Date: Jul. 11, 2019

(65) Prior Publication Data
US 2020/0350340 A1    Nov. 5, 2020

(30) Foreign Application Priority Data

Jan. 3, 2018 (CN) .......................... 201810004387.6

(51) Int. Cl.
*H01L 27/12* (2006.01)
*H01L 27/32* (2006.01)

(52) U.S. Cl.
CPC ........ *H01L 27/127* (2013.01); *H01L 27/1222* (2013.01); *H01L 27/3262* (2013.01); *H01L 27/1248* (2013.01); *H01L 27/3248* (2013.01)

(58) Field of Classification Search
CPC .............. H01L 27/127; H01L 27/1222; H01L 27/3248; H01L 27/3262; H01L 27/1248
See application file for complete search history.

(56) References Cited

U.S. PATENT DOCUMENTS

2004/0233147 A1* 11/2004 Kawachi .............. G09G 3/3233
                                                                    345/82
2005/0173709 A1    8/2005 Lee et al.
(Continued)

FOREIGN PATENT DOCUMENTS

| CN | 1655655 A | 8/2005 |
|----|-----------|--------|
| CN | 103022355 A | 4/2013 |

(Continued)

OTHER PUBLICATIONS

ISA National Intellectual Property Administration of the People's Republic of China, International Search Report Issued in Application No. PCT/CN2018/108324, dated Dec. 28, 2018, WIPO, 14 pages. (Submitted with Partial Translation).
(Continued)

*Primary Examiner* — Aaron J Gray
(74) *Attorney, Agent, or Firm* — McCoy Russell LLP

(57) ABSTRACT

The present disclosure provides a method for manufacturing an array substrate, an array substrate, and a display device. By first forming holes in a first thin film transistor, then simultaneously performing hydrogen supplementation on the first thin film transistor and a second thin film transistor, (Continued)

and then forming holes in the second thin film transistor, the first thin film transistor and the second thin film transistor can be repaired and compensated in different degrees by hydrogen supplementation.

6 Claims, 5 Drawing Sheets

(56) References Cited

U.S. PATENT DOCUMENTS

| | | | |
|---|---|---|---|
| 2015/0069335 A1 | 3/2015 | Hsu | |
| 2016/0233253 A1 | 8/2016 | Kim | |
| 2016/0284733 A1* | 9/2016 | Lee | H01L 27/3248 |
| 2016/0307979 A1* | 10/2016 | Lee | H01L 29/78696 |
| 2017/0213858 A1 | 7/2017 | Li | |
| 2017/0271422 A1 | 9/2017 | Kim et al. | |
| 2017/0287946 A1 | 10/2017 | Hiromasu et al. | |
| 2017/0301796 A1 | 10/2017 | Ishihara et al. | |
| 2020/0295056 A1* | 9/2020 | Hideo | H01L 27/1251 |

FOREIGN PATENT DOCUMENTS

| | | |
|---|---|---|
| CN | 105185788 A | 12/2015 |
| CN | 105632905 A | 6/2016 |
| CN | 106384727 A | 2/2017 |

OTHER PUBLICATIONS

State Intellectual Property Office of the People's Republic of China, Office Action and Search Report Issued in Application No. 201810004387.6, dated Aug. 20, 2020, 10 pages. (Submitted with Partial Translation).

European Patent Office, Extended European Search Report Issued in Application No. 18898178.1, dated Aug. 26, 2021, Germany, 7 pages.

* cited by examiner

METHOD FOR MANUFACTURING ARRAY SUBSTRATE, ARRAY SUBSTRATE AND DISPLAY DEVICE

CROSS-REFERENCE TO RELATED APPLICATIONS

This application is a U.S. national phase of International Application No. PCT/CN2018/108324 filed on Sep. 28, 2018, which claims the benefit and priority of Chinese Application No. 201810004387.6, filed on Jan. 3, 2018, the disclosures of which are incorporated in their entirety by reference herein.

TECHNICAL FIELD

The present disclosure relates to the field of display technologies, and in particular to a method for manufacturing an array substrate, an array substrate, and a display device.

BACKGROUND

Due to the rise of the global information society and the development of technologies, display technologies are changing rapidly and there are more and more kinds of display technologies, such as the liquid crystal display technology, the organic light-emitting diode (OLED) display technology and the electrophoretic display technology. Comparing with other kinds of display devices, OLED display devices have advantages of self-luminous display, fast response, high brightness and wide viewing angle, and thus have wide application prospects. However, the OLED display device has disadvantages such as uneven illumination and presence of light and dark mura at different positions.

SUMMARY

One embodiment of the present disclosure provides a method of manufacturing an array substrate, including:

forming a plurality of pixel structures on a base substrate; wherein at least one of the plurality of pixel structures includes a first thin film transistor having at least one insulating layer and at least one second thin film transistor having at least one insulating layer;

forming holes in the at least one insulating layer of the first thin film transistor;

performing hydrogen supplementation on the first thin film transistor and the at least one second thin film transistor; and forming holes in the at least one insulating layer of the at least one second thin film transistor.

One embodiment of the present disclosure further provides an array substrate which is manufactured by the above method.

One embodiment of the present disclosure further provides a display device including the above array substrate.

One embodiment of the present disclosure further provides an array substrate including: a base substrate; and a plurality of pixel structures on the base substrate. Each of the plurality of pixel structures includes a driving thin film transistor and at least one switch thin film transistor. A hydrogen ion concentration in an active layer of the driving thin film transistor is lower than a hydrogen ion concentration in an active layer of the at least one switch thin film transistor.

One embodiment of the present disclosure further provides a display device including the above array substrate.

BRIEF DESCRIPTION OF THE DRAWINGS

In order to illustrate technical solutions according to embodiments of the present disclosure more clearly, drawings to be used in the description of the embodiments will be described briefly hereinafter. Apparently, the drawings described hereinafter are only some embodiments of the present disclosure, and other drawings may be obtained by those skilled in the art according to those drawings without creative work.

DETAILED DESCRIPTION

The technical solution of embodiments of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Although the OLED display technology has many advantages, in the OLED display device, there are certain defect differences in the low-temperature polysilicon due to more or less grain boundaries in the low-temperature polysilicon, resulting in insufficient structural uniformity of the active layer. Thus, it is necessary to use hydrogenation process to perform hydrogen supplementation on the active layer. However, simply performing hydrogen supplementation treatment on thin film transistors on the array substrate will increase differences in driving current, resulting in uneven light emission of the OLED display device with light and dark mura appearing at different positions.

In view of this, one embodiment of the present disclosure provides a method for manufacturing an array substrate, an array substrate and a display device, which can solve the problem of uneven light emission of the OLED display device with light and dark mura appearing at different positions.

Figure 1:
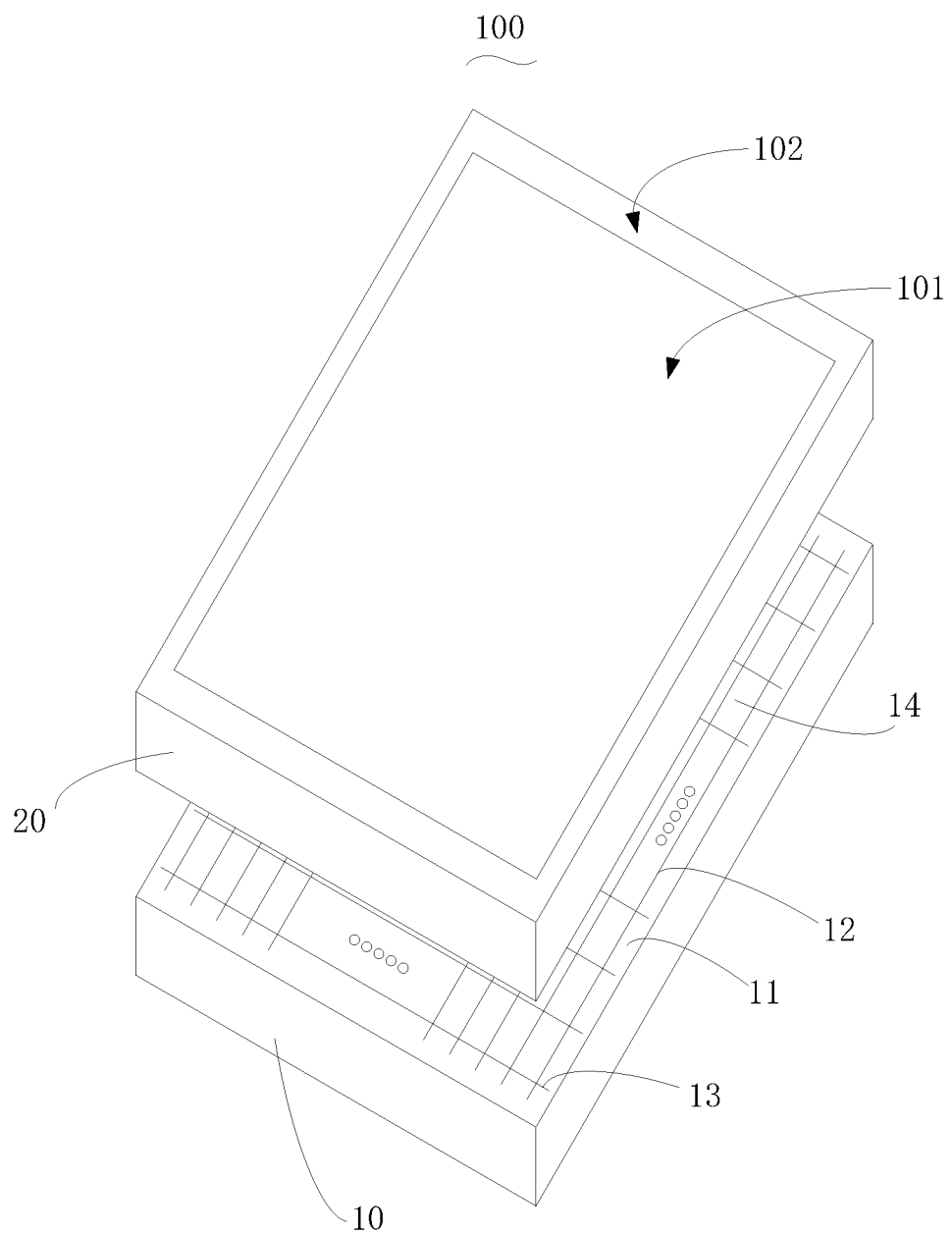
FIG. 1 is a perspective view of a display device according to some embodiments of the present disclosure.

Referring to FIG. 1, FIG. 1 is a perspective view of a display device according to some embodiments of the present disclosure. As shown in FIG. 1, a display device 100 includes an array substrate 10 and an opposite substrate 20. The array substrate 10 is disposed opposite to the opposite substrate 20, thereby together forming a display panel of the display device 100 and then implementing display function of the display device 100. The display device 100 further includes a display region 101 and a peripheral region 102 around the display region 101. The display region 101 is mainly used to implement the display function of the display device 100, and the peripheral region 102 is mainly used for wiring and the like.

The array substrate 10 includes a base substrate 11, data lines 12 and gate lines 13 on the base substrate 11. The data lines 12 extend in a first direction on the base substrate 11, and the data lines 12 are arranged in parallel along a second direction. The gate lines 13 extend in the second direction on the base substrate 11, and the gate lines 13 are arranged in parallel along the first direction.

An orthographic projection of the data lines 12 on the base substrate 11 and an orthographic projection of the gate lines 13 on the base substrate 11 cross each other and define an array of pixel structures 14 in the display region 101 of the display device 100. Each pixel structure 14 includes thin film transistors 15 (shown in FIG. 2) which are respectively connected to the data line 12 and the gate line 13.

In one embodiment, the display device 100 is an OLED display device, and an OLED layer is further provided on the array substrate 10. However, it is not limited thereto, in other embodiment, the display device 100 may also be a conventional liquid crystal display device.

Figure 2:
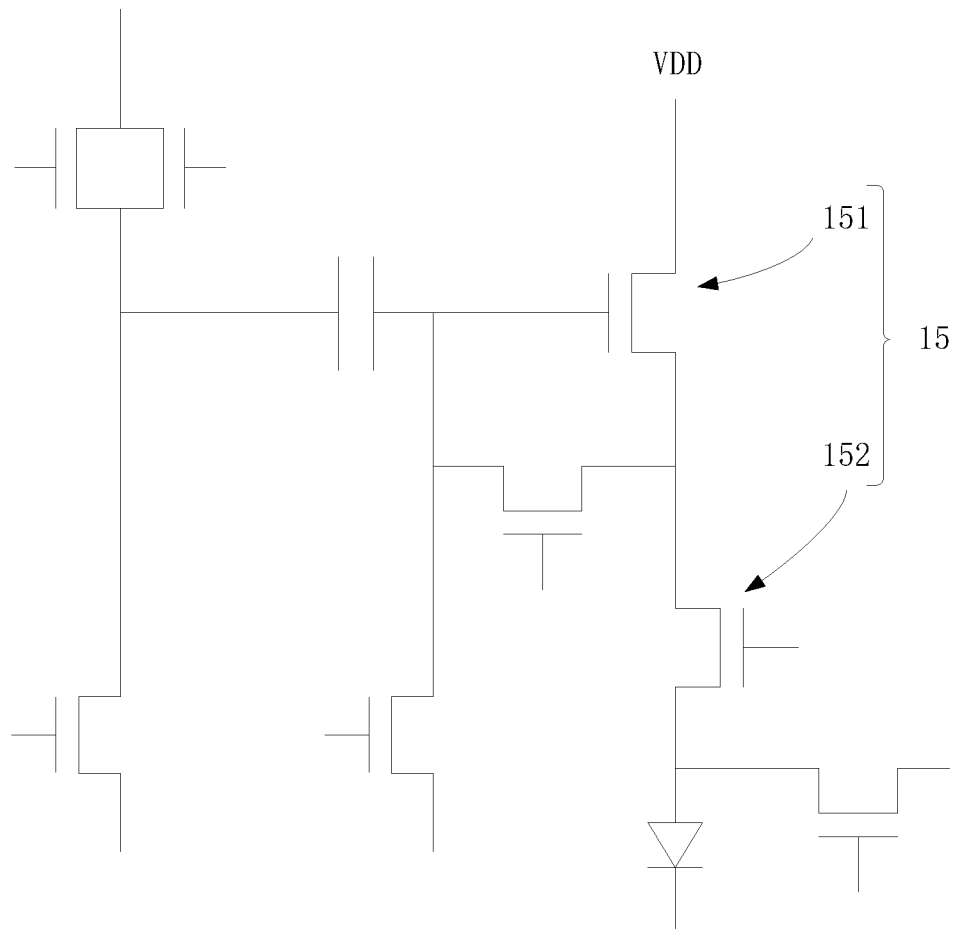
FIG. 2 is a schematic view showing a pixel structure of the display device of FIG. 1.

Referring also to FIG. 2, FIG. 2 is a schematic diagram of the pixel structure of FIG. 1. As shown in FIG. 2, the thin film transistors 15 in each pixel structure 14 include a first thin film transistor 151 and at least one second thin film transistor 152. The first thin film transistor 151 is configured to control size of current of organic light-emitting elements during energizing; and the second thin film transistor 152 is configured to control on or off of the current in a circuit in which it is located.

In one embodiment, there are seven second thin film transistors 152 in each pixel structure 14. In each pixel structure, except for one first thin film transistor 151, all other thin film transistors are second thin film transistors 152, which are not limited thereto. In other embodiment, other numbers of second thin film transistors may also be provided in each pixel structure.

Optionally, the first thin film transistor 151 is a driving thin film transistor, and the second thin film transistor 152 is a switch thin film transistor.

Figure 3:
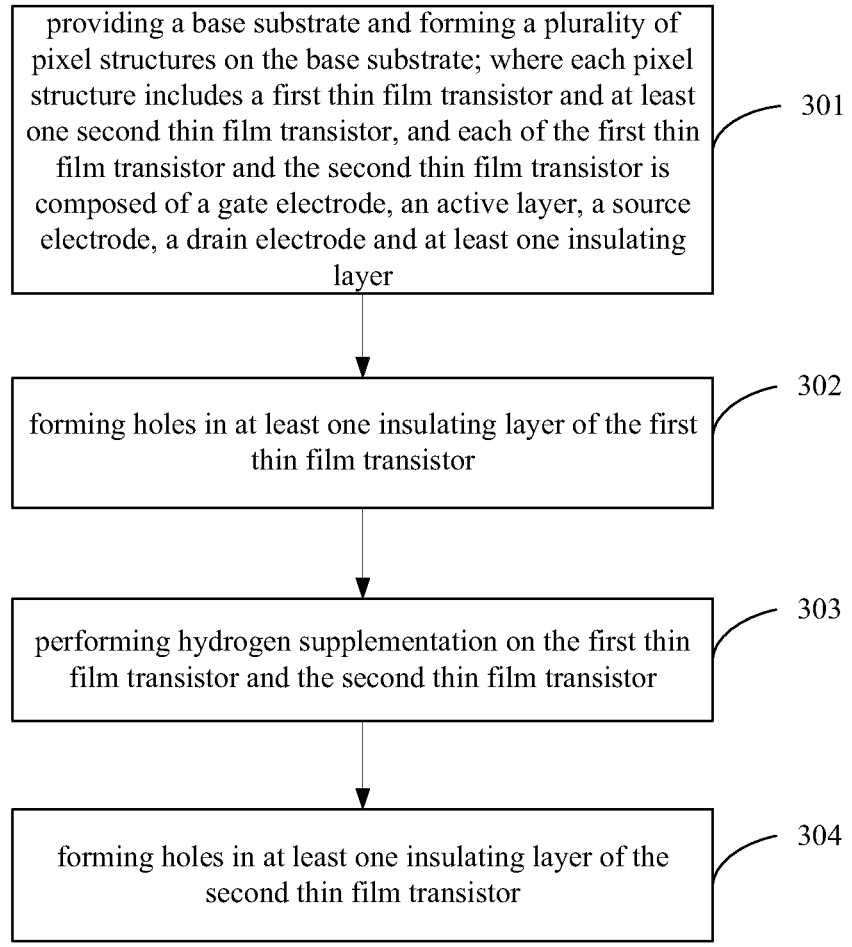
FIG. 3 is a flowchart of a method of manufacturing an array substrate of the display device of FIG. 1.
Figure 4:
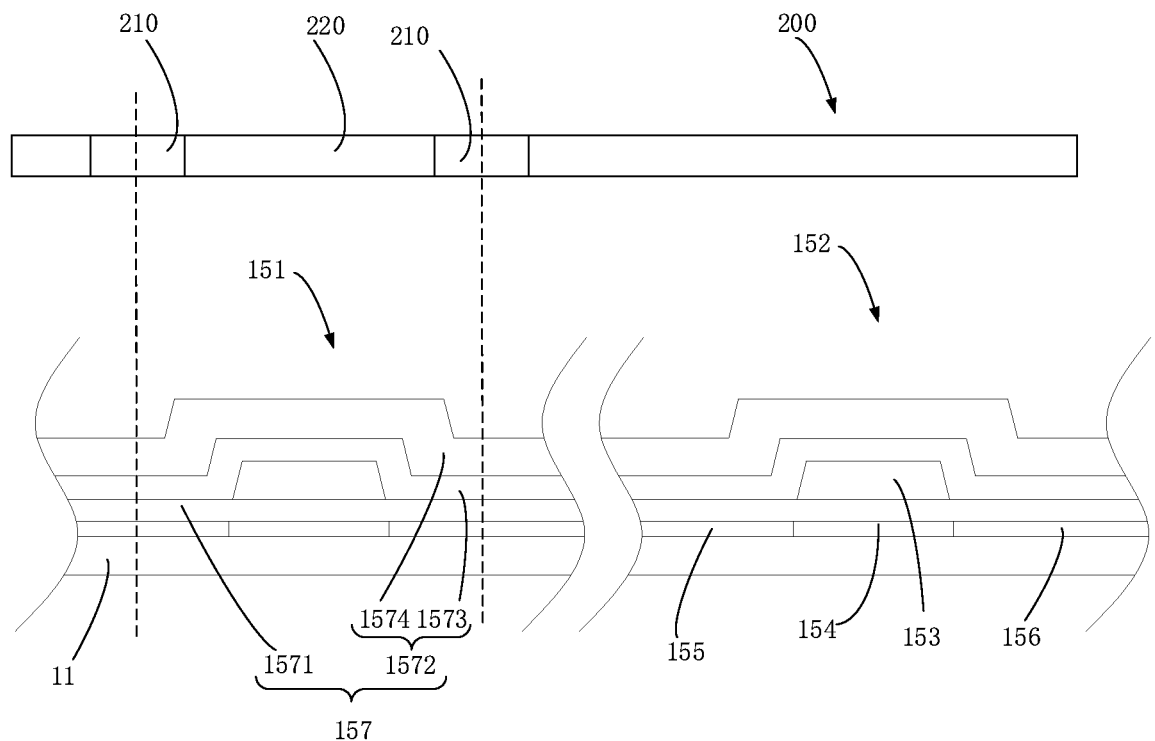
FIG. 4 to FIG. 6 are partial cross-sectional views showing process of manufacturing an array substrate of the display device shown in FIG. 1.
Figure 5:
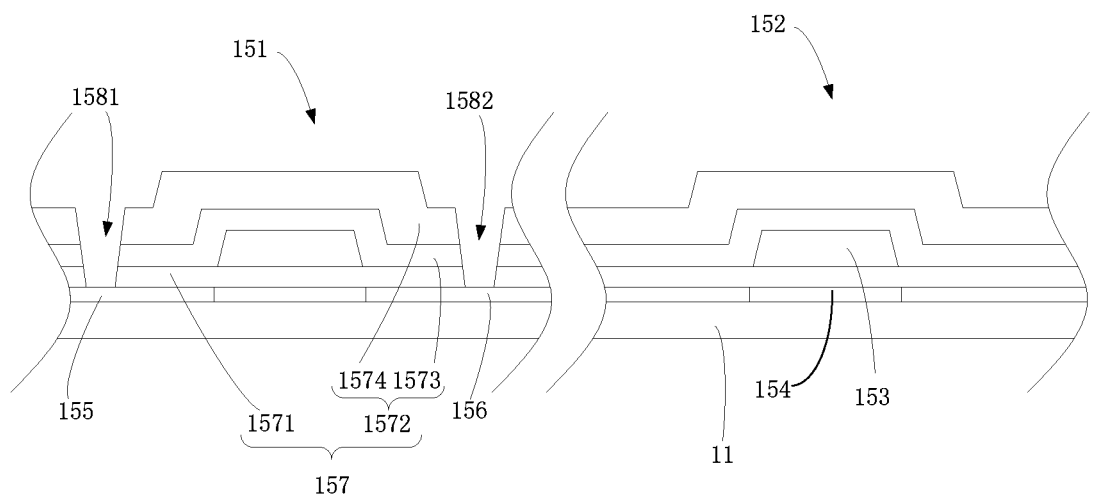
Figure 6:
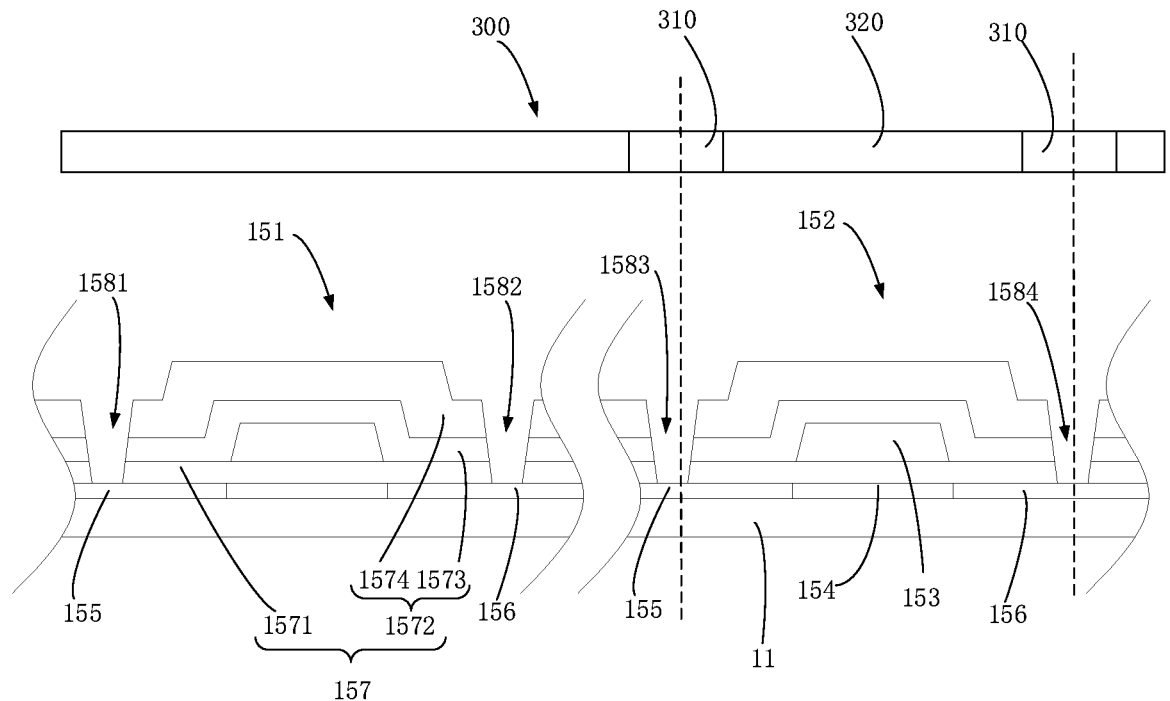
Figure 7:
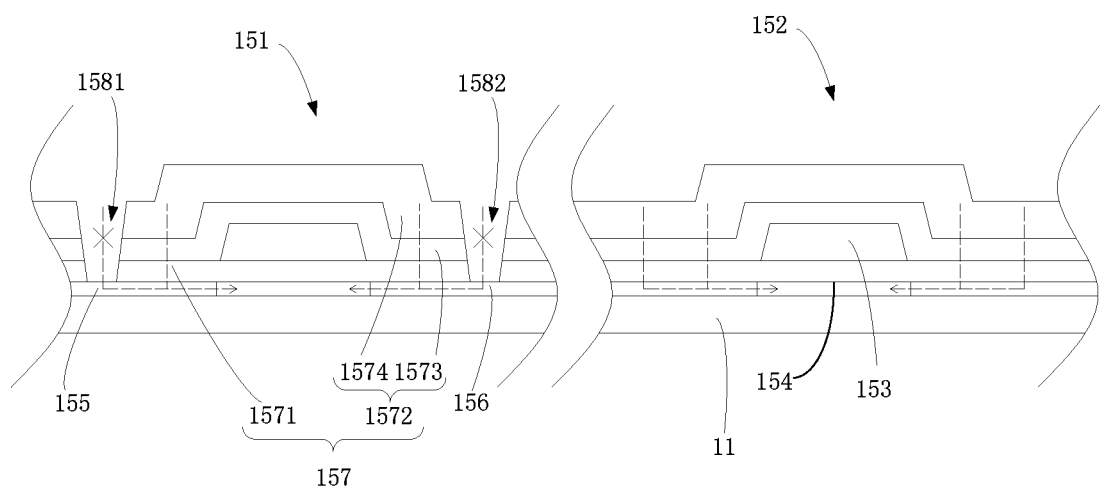
FIG. 7 is a schematic diagram of hydrogen supplementation of a first thin film transistor and a second thin film transistor.

Referring to FIG. 3 to FIG. 7, FIG. 3 shows a method of manufacturing the array substrate of FIG. 1; FIG. 4 to FIG. 6 are partial cross-sectional views showing process of manufacturing the array substrate shown in FIG. 1; and FIG. 7 is a schematic diagram of hydrogen supplementation of a first thin film transistor and a second thin film transistor. As shown in FIG. 3, the method includes the following steps.

Step 301: providing a base substrate and forming a plurality of pixel structures on the base substrate; where each pixel structure includes a first thin film transistor and at least one second thin film transistor, and each of the first thin film transistor and the second thin film transistor is composed of a gate electrode, an active layer, a source electrode, a drain electrode and at least one insulating layer.

In this step, a base substrate 11 is first provided. Then, a gate electrode 153, an active layer 154, a source electrode 155, a drain electrode 156 and at least one insulating layer 157 are formed on the base substrate 11, respectively. The gate electrode 153, the active layer 154, the source electrode 155, the drain electrode 156 and the at least one insulating layer 157 form the thin film transistors 15, that is, the first thin film transistor 151 and the second thin film transistor 152 as shown in FIG. 4 are formed.

Optionally, in one embodiment, the at least one insulating layer 157 includes a gate insulating layer 1571 and at least one protection layer 1572, which are not limited thereto. In other embodiment, the at least one insulating layer may also include one of a gate insulating layer and at least one protection layer.

In one embodiment, the at least one protection layer 1572 includes a first passivation layer 1573 and a second passivation layer 1574.

In one embodiment, the active layer 154 is on the base substrate 11. The source electrode 155 and the drain electrode 156 are respectively located at two sides of the active layer 154. The source electrode 155 and the drain electrode 156 are in contact with two ends of the active layer 154, respectively. The gate insulating layer covers the active layer 154, the source electrode 155 and the drain electrode 156. The gate electrode 153 is disposed on the gate insulating layer 1571 and located above the active layer 154. The first passivation layer 1573 covers the gate electrode 153 and the gate insulating layer 1571. The second passivation layer 1574 is located on the first passivation layer 1573.

The gate lines 13 (shown in FIG. 1) may also be formed simultaneously in the process of forming the gate electrode 153. The data lines 12 (shown in FIG. 1) may also be formed simultaneously in the process of forming the source electrode 155. In this way, a plurality of pixel structures is formed on the base substrate 11 with the first thin film transistor 151 and the second thin film transistor 152 in the pixel structure.

Step 302: forming holes in at least one insulating layer of the first thin film transistor.

In this step, after the first thin film transistor 151 and the second thin film transistor 152 are formed on the base substrate 11, holes may be formed in the first thin film transistor 151, thereby forming through holes in at least one insulating layer 157 of the thin film transistor 151 to expose the source electrode 155 and the drain electrode 156 of the first thin film transistor 151.

Specifically, a first mask 200 (as shown in FIG. 4) having light transmission regions 210 and opaque regions 220 may be first provided. The first mask is aligned with the base substrate 11, so that the light transmission regions of the first mask are respectively corresponding to the source electrode 155 and the drain electrode 156 of the first thin film transistor 151, and are respectively located above the source electrode 155 and the drain electrode 156 of the first thin film transistor 151. Then, the at least one insulating layer 157 of the first thin film transistor 151 is patterned by using the first mask, thereby forming a first through hole 1581 and a second through hole 1582 in the at least one insulating layer 157, as shown in FIG. 5. The first through hole 1581 is located above the source electrode 155 of the first thin film transistor 151, and the second through hole 1582 is located above the drain electrode 156 of the first thin film transistor 151, thereby exposing the source electrode 155 and the drain electrode 156 of the first thin film transistor 151 as shown in FIG. 5.

In one embodiment, the first through hole 1581 and the second through hole 1582 are defined through the gate insulating layer 1571, the first passivation layer 1573 and the second passivation layer 1574 of the first thin film transistor 151, respectively, which are not limited thereto. In other embodiments, for example, in a bottom-gate type thin film transistor, there is no gate insulating layer on the source electrode and the drain electrode, and only a first passivation layer and a second passivation layer are provided, that is, the at least one insulating layer includes the first passivation layer and the second passivation layer, then, it is only needed to form holes in the first passivation layer and the second passivation layer, thereby forming through holes to expose the source electrode and the drain electrode.

Step 303: performing hydrogen supplementation on the first thin film transistor and the second thin film transistor.

In this step, after the first through hole 1581 and the second through hole 1582 are formed in the first thin film transistor 151, hydrogen supplementation may be performed on the first thin film transistor 151 and the second thin film transistor 152, thereby repairing internal defects of the active layer 154 of the first thin film transistor 151 and the second thin film transistor 152.

Specifically, performing hydrogen supplementation on the first thin film transistor 151 and the second thin film transistor 152 may include: placing the first thin film transistor 151 and the second thin film transistor 152 in a sealed container; then, heating the sealed container so that the temperature in the sealed container reaches a high temperature of 440 degrees to 460 degrees; maintaining the temperature in the sealed container at the high temperature of 440 degrees to 460 degrees, and continuing heating for 28 minutes to 32 minutes, thereby enabling hydrogen ions in the at least one insulating layer 157 of the first thin film transistor 151 and the second thin film transistor 152 to diffuse into the active layer 154.

In one embodiment, performing hydrogen supplementation on the first thin film transistor 151 and the second thin film transistor 152 includes: placing the first thin film transistor 151 and the second thin film transistor 152 in a sealed container; maintaining the temperature in the sealed container at the high temperature of 450 degrees, and continuing heating for 30 minutes, thereby enabling hydrogen ions in the at least one insulating layer 157 of the first thin film transistor 151 and the second thin film transistor 152 to diffuse into the active layer 154.

Referring to FIG. 7, FIG. 7 is a schematic diagram of hydrogen supplementation of a first thin film transistor and a second thin film transistor. As shown in FIG. 7, when performing hydrogen supplementation on the first thin film transistor 151 and the second thin film transistor 152, hydrogen ions diffuse into the active layer 154 from the at least one insulating layer 157 of the first thin film transistor 151 and the second thin film transistor 152, along paths indicated by broken line as shown in FIG. 7. Due to the presence of the first through hole 1581 and the second through hole 1582 in the at least one insulating layer 157 of the first thin film transistor 151, there is no hydrogen source for providing hydrogen ions to the active layer 154, at positions corresponding to the first through hole 1581 and the second through hole 1582. Thus, the presence of the first through hole and the second through hole is equivalent to reduction of the hydrogen source for providing hydrogen ions to the active layer 154 in the first thin film transistor 151. Since no through hole is defined in the second thin film transistor 152, the hydrogen source for providing hydrogen ions to the active layer 154 in the second thin film transistor 152 is sufficient, and more hydrogen ions can be provided to the active layer 154.

In contrast, since the first thin film transistor 151 is provided with through holes, the hydrogen source is reduced, and then the hydrogen supplementation effect of the first thin film transistor 151 is weakened. In this way, a slope of a current-voltage curve of the first thin film transistor 151 can be appropriately reduced, thereby reducing current difference caused by difference in threshold voltages. The hydrogen supplementation of the second thin film transistor 152 is normal, and the hydrogen supplementation effect of the second thin film transistor 152 may be considered to be enhanced as compared with the first thin film transistor 151. In this way, the electron mobility of the second thin film transistor 152 can be increased as much as possible, charging capacity of a capacitor can be increased, and the current difference between circuits can be reduced, so that the display device 100 can emit light uniformly, reduce probability of occurrence of Mura, and reduce the Mura effect.

Step 304: forming holes in at least one insulating layer of the second thin film transistor.

In this step, after performing hydrogen supplementation on the first thin film transistor 151 and the second thin film transistor 152, holes may be formed in the second thin film transistor 152, thereby forming through holes 1583, 1584 in at least one insulating layer 157 of the second thin film transistor 152 to expose the source electrode 155 and the drain electrode 156 of the second thin film transistor 152, as shown in FIG. 6.

Specifically, a second mask 300 (as shown in FIG. 6) having light transmission regions 310 and opaque regions 320 may be first provided. The second mask is aligned with the base substrate 11, so that the light transmission regions of the second mask are respectively corresponding to the source electrode 155 and the drain electrode 156 of the second thin film transistor 152, and are respectively located above the source electrode 155 and the drain electrode 156 of the second thin film transistor 152. Then, the at least one insulating layer 157 of the second thin film transistor 152 is patterned by using the second mask, thereby forming a third through hole 1583 and a fourth through hole 1584 in the at least one insulating layer 157, as shown in FIG. 6. The third through hole 1583 is located above the source electrode 155 of the second thin film transistor 152, and the fourth through hole 1584 is located above the drain electrode 156 of the second thin film transistor 152, thereby exposing the source electrode 155 and the drain electrode 156 of the second thin film transistor 152 as shown in FIG. 6.

In one embodiment, the third through hole 1583 and the fourth through hole 1584 are defined through the gate insulating layer 1571, the first passivation layer 1573 and the second passivation layer 1574 of the second thin film transistor 152, respectively, which are not limited thereto. In other embodiments, for example, in a bottom-gate type thin film transistor, there is no gate insulating layer on the source electrode and the drain electrode, and only a first passivation layer and a second passivation layer are provided, that is, the at least one insulating layer includes the first passivation layer and the second passivation layer, then, it is only needed to form holes in the first passivation layer and the second passivation layer, thereby forming through holes to expose the source electrode and the drain electrode.

In one embodiment, holes are first formed above the source electrode 155 and the drain electrode 156 of the first thin film transistor 151, and then the first thin film transistor 151 and the second thin film transistor 152 are subjected to hydrogen supplementation treatment. In this way, the first thin film transistor 151 and the second thin film transistor 152 can be repaired and compensated in different degrees. The present disclosure is not limited thereto, and in other embodiments, holes may be respectively formed in lateral sides of the source electrode and the drain electrode of the first thin film transistor, thereby exposing the source electrode and the drain electrode from the lateral sides. Holes may also be formed in a certain area near the source electrode and the drain electrode of the first thin film transistor without exposing the source electrode and the drain electrode. For example, holes may be formed in a certain area at lateral sides of the source electrode and the drain electrode, or holes may be formed above the source electrode and the drain electrode without exposing the source electrode and the drain electrode, and then the first thin film transistor and the second thin film transistor are subjected to hydrogen supplementation treatment, so that the first thin film transistor and the second thin film transistor can be repaired and compensated in different degrees.

One embodiment of the present disclosure further provides an array substrate. As shown in FIG. 1 and FIG. 4 to FIG. 6, an array substrate 10 includes a base substrate 11 and a plurality of pixel structures 14 disposed on the base substrate 11. Each pixel structure 14 includes a driving thin film transistor 151 and at least one switch thin film transistor 152. A hydrogen ion concentration in an active layer 154 of the driving thin film transistor is lower than a hydrogen ion concentration in an active layer 154 of the at least one switch thin film transistor.

One embodiment of the present disclosure further provides a display device including the above array substrate 10.

In the method for manufacturing an array substrate, the array substrate, and the display device provided in the embodiments of the present disclosure, a base substrate is provided and a plurality of pixel structures is formed on the base substrate. Each pixel structure includes a first thin film transistor and at least one second thin film transistor, and each of the first thin film transistor and the second thin film transistor is composed of a gate electrode, an active layer, a source electrode, a drain electrode and at least one insulating layer. Then, holes are formed in at least one insulating layer of the first thin film transistor, and hydrogen supplementation is performed on the first thin film transistor and the second thin film transistor. And then, holes are formed in at least one insulating layer of the second thin film transistor. In this way, by first forming holes in the first thin film transistor, then simultaneously performing hydrogen supplementation on the first thin film transistor and the second thin film transistor, and then forming holes in the second thin film transistor, the first thin film transistor and the second thin film transistor can be repaired and compensated in different degrees by hydrogen supplementation. Since the first thin film transistor 151 is provided with through holes, the hydrogen supplementation effect of the first thin film transistor is weakened. In this way, a slope of a current-voltage curve of the first thin film transistor can be appropriately reduced, thereby reducing current difference caused by difference in threshold voltages. Meanwhile, the electron mobility of the second thin film transistor can be increased as much as possible, charging capacity of a capacitor can be increased, and the current difference between circuits can be reduced, so that the display device can emit light uniformly, reduce probability of occurrence of Mura, and reduce the Mura effect.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure. Therefore, the protection scope of the present disclosure should be determined by the scope of the claims.

The invention claimed is:

1. A method of manufacturing an array substrate, comprising:
   forming a plurality of pixel structures on a base substrate;
   wherein at least one of the plurality of pixel structures comprises a first thin film transistor having at least one insulating layer, at least one second thin film transistor having at least one insulating layer;
   forming holes in the at least one insulating layer of the first thin film transistor without exposing a source electrode and a drain electrode of the first thin film transistor;
   wherein an active layer of the first thin film transistor and an active layer of the second thin film transistor are made of a low-temperature polysilicon;
   performing hydrogen supplementation on the first thin film transistor and the at least one second thin film transistor in such a manner that a hydrogen ion concentration in the active layer of the first thin film transistor is lower than a hydrogen ion concentration in the active layer of the second thin film transistor; and
   forming holes in the at least one insulating layer of the at least one second thin film transistor after performing hydrogen supplementation;
   wherein the performing hydrogen supplementation on the first thin film transistor and the at least one second thin film transistor, comprises:
      placing the first thin film transistor and the at least one second thin film transistor in a sealed container with a temperature of 440 degrees to 460 degrees, and continuously heating for 28 minutes to 32 minutes, thereby enabling some hydrogen ions in the at least one insulating layer of the first thin film transistor to diffuse into the active layer of the first thin film transistor, and enabling some hydrogen ions in the at least one insulating layer of the at least one second thin film transistor to diffuse into the active layer of the at least one second thin film transistor;
   wherein the first thin film transistor is a driving thin film transistor, the at least one second thin film transistor is a switch thin film transistor, and the second thin film transistor is electrically connected to the first thin film transistor.

2. The method according to claim 1, wherein the at least one second thin film transistor further comprises a gate electrode, a source electrode and a drain electrode, respectively.

3. The method according to claim 2, wherein the forming holes in the at least one insulating layer of the first thin film transistor, comprises:
   aligning a first mask with the base substrate;
   patterning the at least one insulating layer of the first thin film transistor by using the first mask, thereby forming a first through hole and a second through hole in the at least one insulating layer of the first thin film transistor.

4. The method according to claim 3, wherein the forming holes in the at least one insulating layer of the at least one second thin film transistor, comprises:
   aligning a second mask with the base substrate;
   patterning the at least one insulating layer of the at least one second thin film transistor by using the second mask, thereby forming a third through hole and a fourth through hole in the at least one insulating layer of the at least one second thin film transistor to expose the source electrode and the drain electrode of the at least one second thin film transistor, respectively.

5. The method according to claim 1, wherein the performing hydrogen supplementation on the first thin film transistor and the at least one second thin film transistor, comprises:
   placing the first thin film transistor and the at least one second thin film transistor in the sealed container with a temperature of 450 degrees, and continuously heating for 30 minutes, thereby enabling some hydrogen ions in the at least one insulating layer of the first thin film transistor to diffuse into the active layer of the first thin film transistor, and enabling some hydrogen ions in the at least one insulating layer of the at least one second thin film transistor to diffuse into the active layer of the at least one second thin film transistor.

6. The method according to claim 2, wherein the at least one insulating layer of the first thin film transistor comprises a gate insulating layer and/or at least one protection layer; the at least one insulating layer of the at least one second thin film transistor includes comprises a gate insulating layer and/or at least one protection layer.

* * * * *